United States Patent
Pi et al.

(10) Patent No.: US 9,628,079 B2
(45) Date of Patent: Apr. 18, 2017

(54) LEVEL SHIFTER CIRCUIT

(71) Applicant: ELECTRONICS AND TELECOMMUNICATIONS RESEARCH INSTITUTE, Daejeon (KR)

(72) Inventors: Jae-Eun Pi, Daejeon (KR); Chunwon Byun, Daejeon (KR); OhSang Kwon, Daejeon (KR); Eunsuk Park, Daejeon (KR); Min Ki Ryu, Daejeon (KR); Chi-Sun Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/050,187

(22) Filed: Feb. 22, 2016

(65) Prior Publication Data

US 2016/0248426 A1 Aug. 25, 2016

(30) Foreign Application Priority Data

Feb. 23, 2015 (KR) .................. 10-2015-0025283

(51) Int. Cl.
*H03K 3/01* (2006.01)
*H03K 19/0185* (2006.01)

(52) U.S. Cl.
CPC .................. *H03K 19/018507* (2013.01)

(58) Field of Classification Search
CPC ... H03K 19/018507; H03K 19/018521; H03K 19/00315
USPC .............. 327/333, 534–538; 326/62–81
See application file for complete search history.

(56) References Cited

U.S. PATENT DOCUMENTS

| 8,710,866 B2 | 4/2014 | Park et al. |
| 8,749,900 B2 | 6/2014 | Duan et al. |
| 2014/0062572 A1 | 3/2014 | Pi et al. |

FOREIGN PATENT DOCUMENTS

| KR | 10-2014-0029111 A | 3/2014 | |
| WO | WO 2013139976 A1 * | 9/2013 | ............ H02M 3/073 |

OTHER PUBLICATIONS

Binn Kim et al., "A Novel Level Shifter Employing IGZO TFT", IEEE Electron Device Letters, Feb. 2011, pp. 167-169, vol. 32, No. 2, IEEE.

* cited by examiner

*Primary Examiner* — Lincoln Donovan
*Assistant Examiner* — Thomas Skibinski (57) ABSTRACT

A level shifter circuit a first transistor connected between a power source terminal of the level shifter circuit and an output terminal of the level shifter circuit, the first transistor being configured to transmit, in response to a first signal and a second signal, a power source voltage applied from the power source terminal to the output terminal, the first signal being received from an input terminal of the level shifter circuit through a first gate of the first transistor, the second signal being received through a second gate of the first transistor, and a second transistor connected between a ground terminal of the level shifter circuit and the output terminal, the second transistor being configured to transmit a ground voltage from the ground terminal to the output terminal in response to a gate signal received through a gate of the second transistor.

12 Claims, 11 Drawing Sheets

LEVEL SHIFTER CIRCUIT

CROSS-REFERENCE TO RELATED APPLICATIONS

The present application claims priority under 35 U.S.C. §119 of Korean Patent Application No. 10-2015-0025283, filed on Feb. 23, 2015, the entire contents of which are hereby incorporated by reference.

TECHNICAL FILED

The present disclosure herein relates to a level shifter circuit, and more particularly, to a level shifter circuit including a transistor of a double gate structure.

DESCRIPTION OF THE RELATED ART

Recently, according to a tendency of miniaturization, light weight, and thin shaping of a personal computer or a television, etc., miniaturization, light weight, and thin shaping of a display device are also requested. In order to satisfy this request, a flat panel display device, which is easy to carry, such as a liquid crystal display device or an organic light emitting diode display device is being developed instead of a cathode ray tube (CRT). The flat panel display device includes a thin film transistor (TFT), which plays a role of a switching element.

Typically a voltage used in a semiconductor integrated circuit is a low voltage of 5 V or lower. However, a high voltage of 5V or higher is used in a display device or a specific circuit. For example, a liquid crystal device using a TFT uses a high voltage of approximately 20V or higher as a pulse voltage supplied to a gate line. Accordingly, such a display device would not operate with a low voltage of 5 V or lower, which is used in a typical semiconductor integrated circuit. Accordingly, the low voltage of 5 V or lower should be converted into a high voltage, which is suitable for a display device or a driving circuit for driving the display device.

In order to convert a low voltage into a high voltage level suitable for an operation of the display device and driving circuit, a level shifter is used. The level shifter is mainly provided with a silicon wafer, an amorphous-silicon TFT, or an oxide TFT. However, when a TFT used in a level shifter is formed in a complementary metal-oxide-semiconductor (CMOS) structure, a manufacturing process of the level shifter becomes complex and a manufacturing cost becomes high. In addition, the oxide TFT is difficult to apply to the level shifter, since it exhibits depletion mode characteristic in which a threshold voltage is 0 or negative.

SUMMARY

The present disclosure provides a level shifter circuit, which operates in a depletion mode or an enhancement mode by providing a main transistor thereof with a double gate transistor and by adjusting a threshold voltage thereof.

An embodiment of the inventive concept provides a level shifter circuit comprising a first transistor connected between a power source terminal of the level shifter circuit and an output terminal of the level shifter circuit, the first transistor being configured to transmit, in response to a first signal and a second signal, a power source voltage applied from the power source terminal to the output terminal, the first signal being received from an input terminal of the level shifter circuit through a first gate of the first transistor, the second signal being received through a second gate of the first transistor, and a second transistor connected between a ground terminal of the level shifter circuit and the output terminal, the second transistor being configured to transmit a ground voltage from the ground terminal to the output terminal in response to a gate signal received through a gate of the second transistor.

In an embodiment, the second gate of the first transistor receives the first signal from the input terminal as the second signal.

In an embodiment, the second gate of the first transistor is connected to the output terminal.

In an embodiment, in the power source terminal is a first power source terminal and the power source voltage is a first power source voltage and wherein the second gate of the first transistor receives a second power source voltage from a second power source terminal of the level shifter circuit.

In an embodiment, the second gate of the first transistor receives a clock signal from a clock terminal of the level shifter circuit.

In an embodiment, a period of the clock signal is identical to a period of the first signal.

In an embodiment, when a level of the first signal corresponds to a high level, a level of the clock signal corresponds to a high level, and wherein when the level of the first signal corresponds to a low level, the level of the clock signal corresponding a low level.

In an embodiment, a first level difference between the high level of the first signal and the low level of the first signal has a first value, wherein a second level difference between the high level of the clock signal and the low level of the clock signal has a second value, and wherein the second value is larger than the first value.

In an embodiment, the first transistor is turned on or turned off in response to a threshold voltage generated on the first transistor based on a voltage of the first signal and a voltage of the second signal.

In an embodiment, the first signal is a periodic signal having a first voltage and the ground voltage alternately, wherein a voltage of the output terminal has a second voltage and the ground voltage alternately and periodically, and wherein a voltage level of the second voltage is higher than a voltage level of the first voltage.

In an embodiment, the gate signal is logically complementary to the first signal.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF EMBODIMENTS

It should be understood that both the foregoing general description and a following detailed description are merely illustrative, and it should be construed that supplementary descriptions for claimed inventions be provided. Reference symbols are represented in detail in preferred embodiments of the present invention, of which examples are denoted in the accompanying drawings. In any possible case, like reference numerals refer to like or similar elements throughout the drawings.

In below, a level shifter circuit configured with double gate oxide transistors and a display device including the same are used as one example for illustrating characteristics and functions of the inventive concept. However, those skilled in the art may easily understand other advantages and performance of the inventive concept according to contents described herein. The inventive concept may be implemented or applied through other embodiments. In addition, the detailed description may be modified or altered, not deviating far from the scope, the technical idea, and other objects of the inventive concept.

In descriptions of embodiments, it will also be understood that when a layer is referred to as being "on/under" another layer, it can be directly on the other layer, or intervening layers may also be present. It will be understood that when an element is referred to as being "connected", "coupled", or "adjacent" to another element, it may be directly connected, coupled, or adjacent to the other element or intervening elements may be present.

Figure 1:
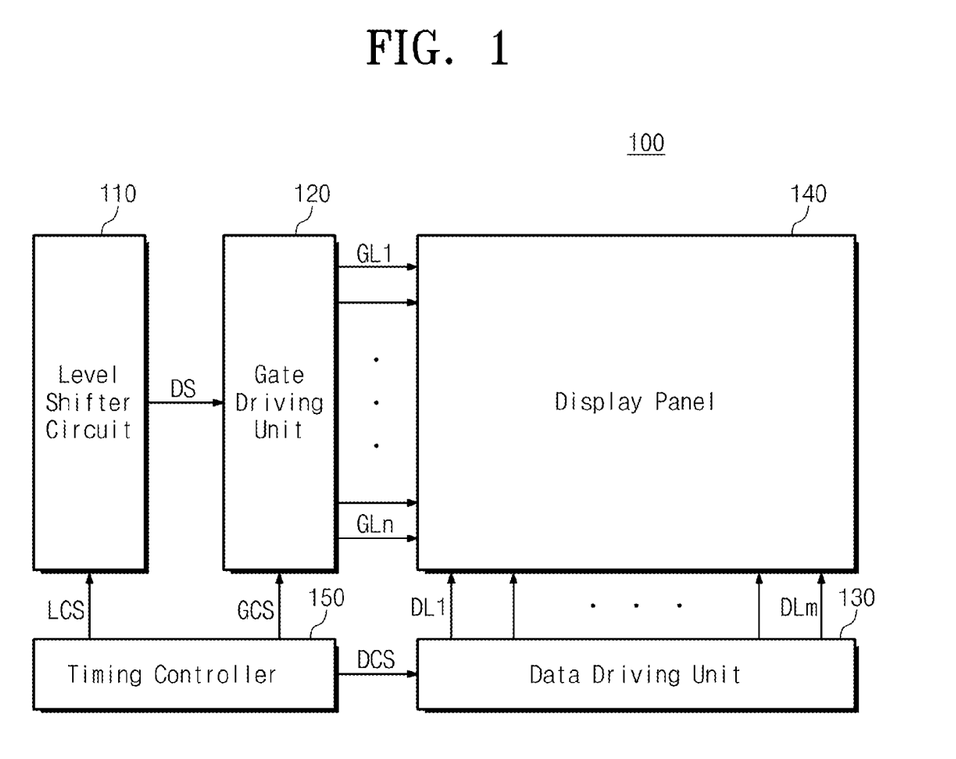
FIG. 1 is a block diagram of a display device according to an embodiment.

FIG. 1 is a block diagram of a display device according to an embodiment. Referring to FIG. 1, a display device 100 may include a level shifter circuit 110, a gate driving unit 120, a data driving unit 130, a display panel 140, and a timing controller 150. The term "unit" may include hardware and/or a special purpose computer programmed to perform the functions of the "unit.

The level shifter circuit 110 may be electrically connected to the gate driving unit 120. The level shifter circuit 110 may apply a driving voltage DS to the gate driving unit 120 according to a level control signal LCS generated from the timing controller 150. In addition, the level shifter circuit 110 may include at least one double gate transistor. Accordingly, leakage current of the level shifter circuit 110 may be cut off and power efficiency increases.

The gate driving unit 120 may be electrically connected to the display panel 140 through a plurality of gate lines GL1 to GLn. The gate driving unit 120 may apply a driving voltage DS to the plurality of gate lines GL1 to GLn according to a gate control signal GCS generated from the timing controller 150. The gate driving unit 120 may apply the driving voltage DS, which is received from the level shifter circuit 110, to the plurality of gate lines GL1 to GLn.

The data driving unit 130 may be electrically connected to the display panel 140 through a plurality of data lines DL1 to DLm. The data driving unit 120 may apply a data voltage to the plurality of data lines DL1 to DLm according to a data control signal DCS generated from the timing controller 150.

The display panel 140 may be electrically connected to the gate driving unit 120 through the plurality of gate lines GL1 to GLn. In addition, the display panel 140 may be electrically connected to the data driving unit 130 through the plurality of data lines DL1 to DLm. The display panel 140 may be connected to the gate lines GL1 to GLn and the data lines DL1 to DLm, and may include a plurality of pixels arrayed in a matrix type. Each pixel may operate according to the data voltage transferred through the data driving unit 130 and the gate voltage transferred through the gate driving unit 120.

The timing controller 150 may control the overall operation of the display device 100. In detail, the timing controller 150 may generate the level control signal LCS to transfer it to the level shifter circuit 110. The timing controller 150 may generate the gate control signal GSL to transfer it to the gate driving unit 120. The timing controller 150 may generate the data control signal DCS to transfer it to the data driving unit 130.

Figure 2A:
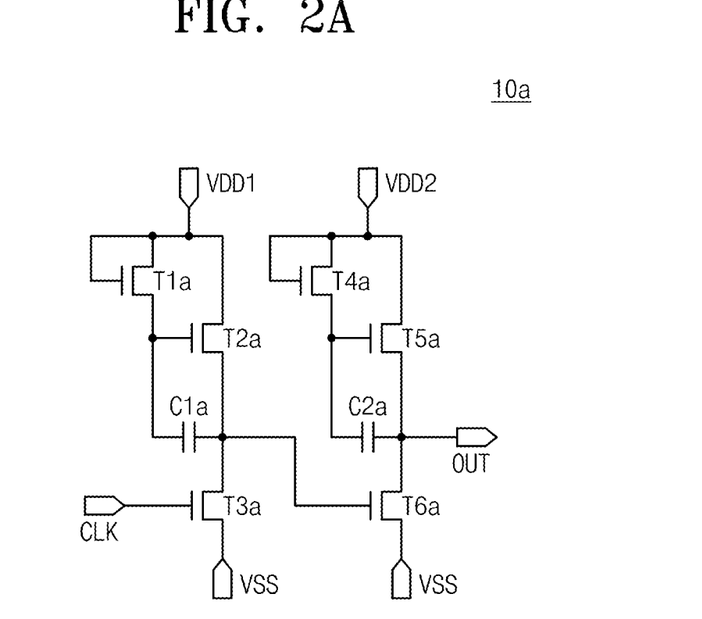
FIGS. 2A and 2B are circuit diagrams showing a level shifter circuit.
Figure 2B:
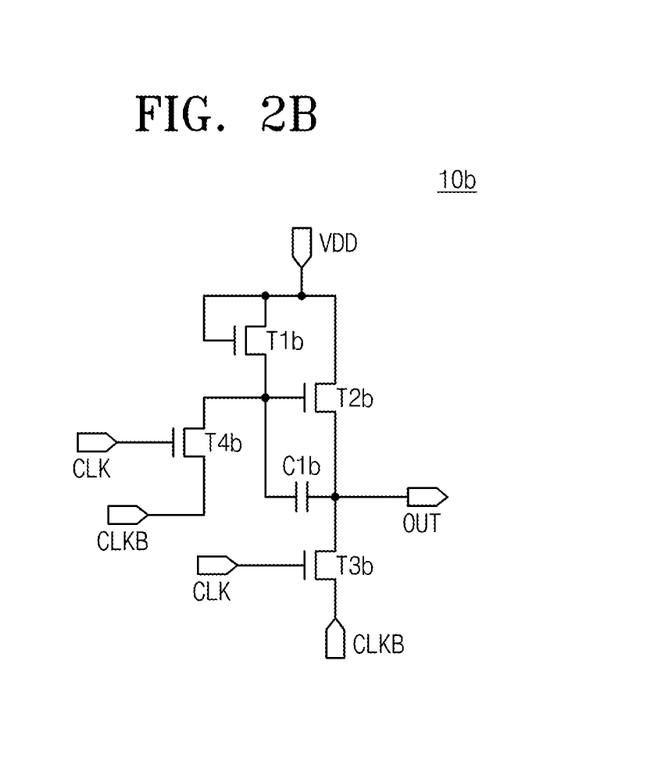

FIGS. 2A and 2B are circuit diagrams showing a level shifter circuit. In FIG. 2A, the level shifter circuit 10*a* includes first to six transistors T1*a* to T6*a* and first and second capacitors C1*a* and C2*a*. The first to sixth transistors T1*a* to T6*a* may be oxide TFTs.

When a first input signal CLK of a high level is input to a gate terminal of the third transistor T3*a*, the third transistor T3*a* is turned on. When the third transistor T3*a* is turned on, as a ground voltage is input to a gate terminal of the sixth transistor T6*a* through a ground terminal VSS, the sixth transistor T6*a* is turned off. When the sixth transistor T6*a* is turned off, a voltage of a node connected to an output terminal OUT is increased to a second power source voltage VDD2. Accordingly, an output voltage $V_{OUT}$ is output through the output terminal OUT.

The first and fourth transistors T1*a* and T4*a* of the level shifter circuit 10*a* of FIG. 2A are diode-connected to the second power source terminal VDD2. Accordingly, power source voltages VDD1 and VDD2 are reduced by threshold voltages of the first and fourth transistors T1*a* and T4*a* and are applied to gate terminals of the second and fifth transistors T2*a* and T5*a*. Therefore, the output voltage $V_{OUT}$ lower than the second power source voltage VDD2 is output through the output terminal OUT. In addition, since the third and sixth transistors T3*a* and T6*a* are oxide TFTs and are not completely turned off by depletion mode characteristic, the output voltage $V_{OUT}$ may be further lowered.

When the first input signal CLK of the high level is input to a gate terminal of the third transistor T3*a*, the second transistor T2*a* is in a turned-on state. Accordingly, a voltage higher than the ground voltage VSS is applied to a gate terminal of the sixth transistor T6*a*, and the sixth transistor T6*a* is not completely turned off. In addition, power consumption may become large due to constant current generation between the ground terminal and the first and second power source terminals VDD1 and VDD2.

The level shifter circuit 10*b* shown in FIG. 2B includes first to fourth transistors T1*b* to T4*b* and a capacitor C1*b*.

The first to fourth transistors T1b to T4b may be oxide TFTs. The first input signal CLK and a second input signal CLKB are complementary signals.

When the first input signal CLK of the high level is applied to the third and fourth transistors T3b and T4b, the second input signal CLKB of a low level is applied to a gate terminal of the second transistor T2b and the output terminal OUT. However, since the first transistor T1b operates in a depletion mode, constant current is generated between the power source terminal VDD and the third transistor T3b and power consumption increases. In addition, the second transistor T2b is not completely turned off by the depletion mode characteristic and the output voltage VOUT does not become a low level. In addition, through the output terminal OUT, a voltage increased by a threshold voltage $V_{TH}$ of the second transistor T2b is output.

When the first input signal CLK of a low level may be applied to gate terminals of the third and fourth transistors T3b and T4b, third and fourth transistors T3b and T4b are turned off. In addition, since the second transistor T2b may be diode-connected to the power supply terminal VDD, a voltage of a node connected to the output terminal OUT may be increased by the power source voltage.

However, since the first transistor T1b has a structure of being diode-connected to the power source terminal VDD, a voltage lower than the power supply voltage is applied to a gate terminal of the second transistor T2b. Accordingly, since the second transistor T2b is not completely turned on, the output voltage $V_{OUT}$ lower than the power source voltage is output.

According to FIGS. 2A and 2B, the characteristics of the level shifter circuits 10a and 10b are degraded by the diode connections and the depletion mode characteristics of the transistors. Although such a limitation is caused by unique characteristic of the oxide TFT, which operates in the depletion mode, when the device is made in a double gate structure to control the threshold voltage, the depletion mode characteristic thereof is compensated to enable power consumption reduction and accurate output transfer.

Figure 3:
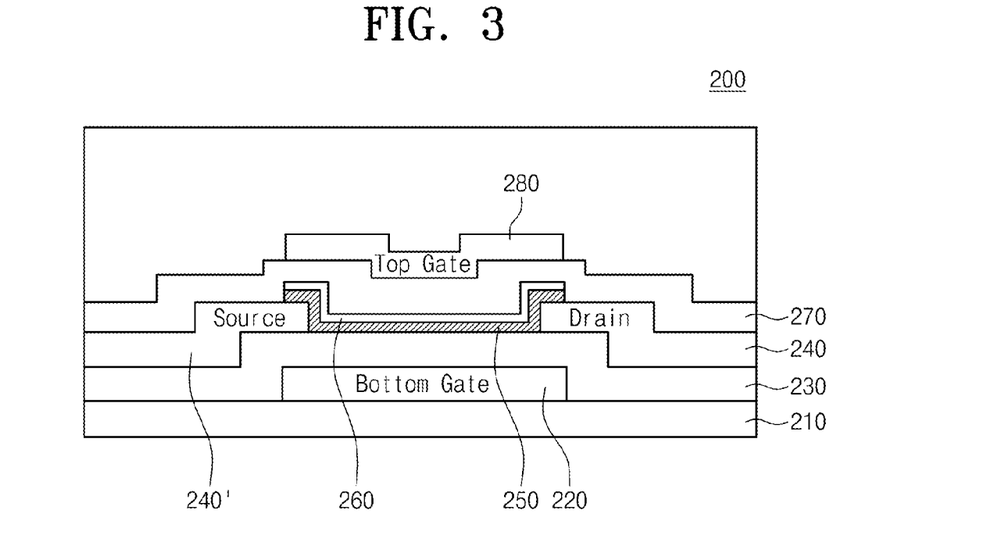
FIG. 3 illustrates a double gate transistor structure included in a level shifter circuit according to an embodiment.

FIG. 3 illustrates a double gate transistor structure included in a level shifter circuit according to an embodiment.

Referring to FIG. 3, the double gate transistor 200 may be provided with a bottom gate 220 on a substrate 210 (e.g. glass). In addition, an insulation film 230 (e.g. aluminum oxide) may be provided to insulate the substrate 210 and the bottom gate 220 from a top material. In addition, a drain 240 and a source 240' may be provided after electrons or holes move to provide an active layer 250, which provides a channel. Then, a protection layer 260 may be provided to prevent damage caused by etching, and then an insulation film 270 (e.g. aluminum oxide) may be provided again. Furthermore, similarly to the bottom gate 200, a top gate 280 may be provided on the insulation layer 270, and the channel width of the active layer 250 may be adjusted.

A level shifter circuit according to an embodiment, a main transistor configuring the level shifter circuit may be a double gate transistor. Accordingly, a voltage applied to the top gate 280 may be adjusted to make a threshold voltage thereof be 0 V or higher in order to improve the depletion type characteristic that a typical oxide TFT has. As a result, degradation of the gate driver may be prevented and power consumption may be reduced.

Figure 4:
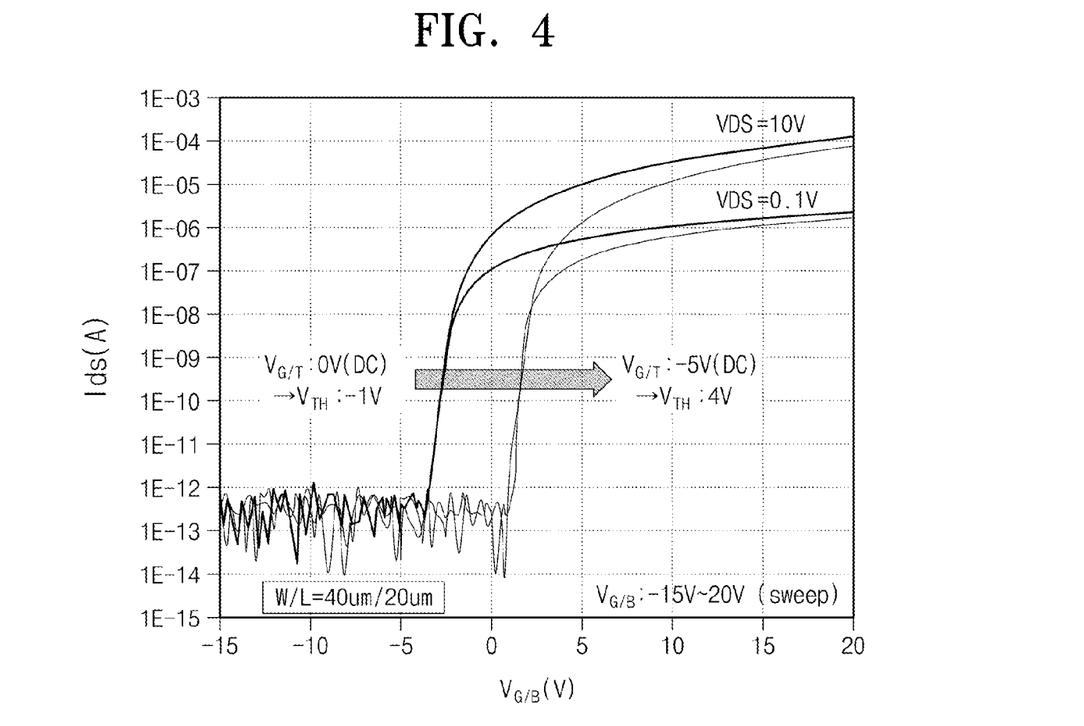
FIG. 4 is a graph showing a transfer characteristic of a double gate transistor structure included in a level shifter circuit according to an embodiment.

FIG. 4 is a graph showing a transfer characteristic of a double gate transistor structure included in a level shifter circuit according to an embodiment. A horizontal axis of the graph may denote a bottom gate voltage $V_{G/B}$ applied to the bottom gate BG. A vertical axis may denote drain-source current Ids applied to the drain and source terminals of the transistor.

Typically, there are some cases where a threshold voltage of an oxide TFT has a negative value due to a voltage or stress caused by light or due to process characteristic. Accordingly, the transistor configuring the level shifter circuit is not completely powered off and a normal circuit operation is not possible. When the transistor has a negative threshold voltage, power consumption may largely increase.

FIG. 4 exemplarily illustrates a graph when the magnitudes of a drain-source voltage VDS, which is applied to the drain and source terminals of the transistor, are 0.1 V and 10 V. Referring to FIG. 4, when a voltage $V_{G/T}$ applied to the top gate is 0 V, the threshold voltage $V_{TH}$ may be −1 V. However, when the voltage $V_{G/T}$ applied to the top gate is −5 V, the threshold voltage $V_{TH}$ is 4 V that is positive. In other words, unlike the case where an excessive negative voltage is applied to the gate in order to completely turn off the transistor in a typical single gate transistor, the voltage applied to the bottom gate is adjusted to completely turn off the transistor.

According to an embodiment, the voltage applied to the top gate may be adjusted to make the threshold voltage of the transistor 0 V or higher. As a result, the transistor may be completely turned off to prevent leakage current and to reduce power consumption. In addition, the excessive negative voltage is prevented from being applied to the gate of the transistor and a degradation phenomenon may be prevented.

Figure 5:
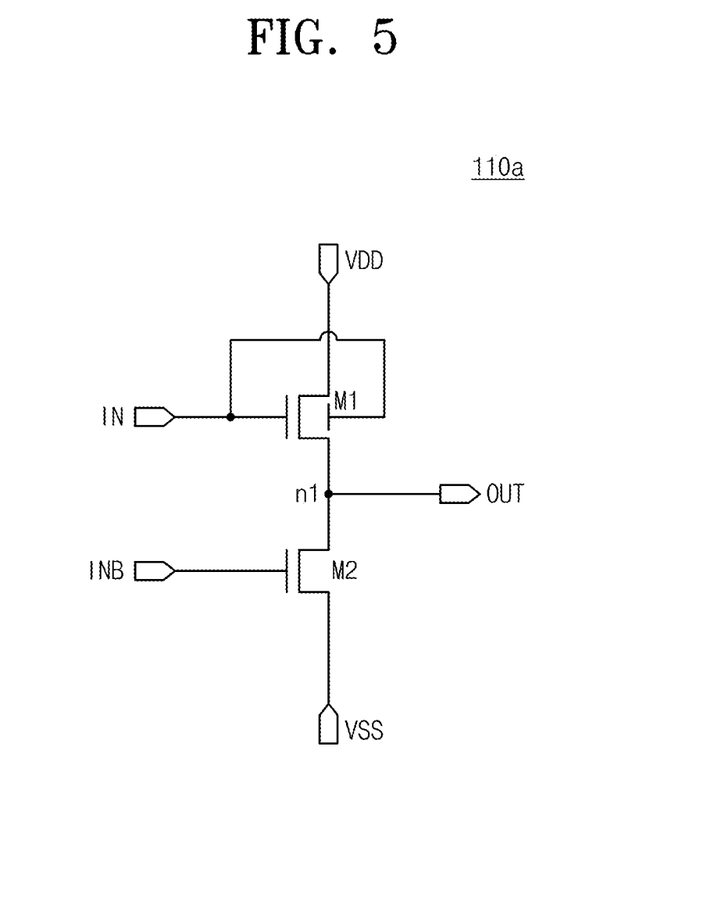
FIG. 5 is a circuit diagram illustrating a level shifter circuit according to a first embodiment.
Figure 6:
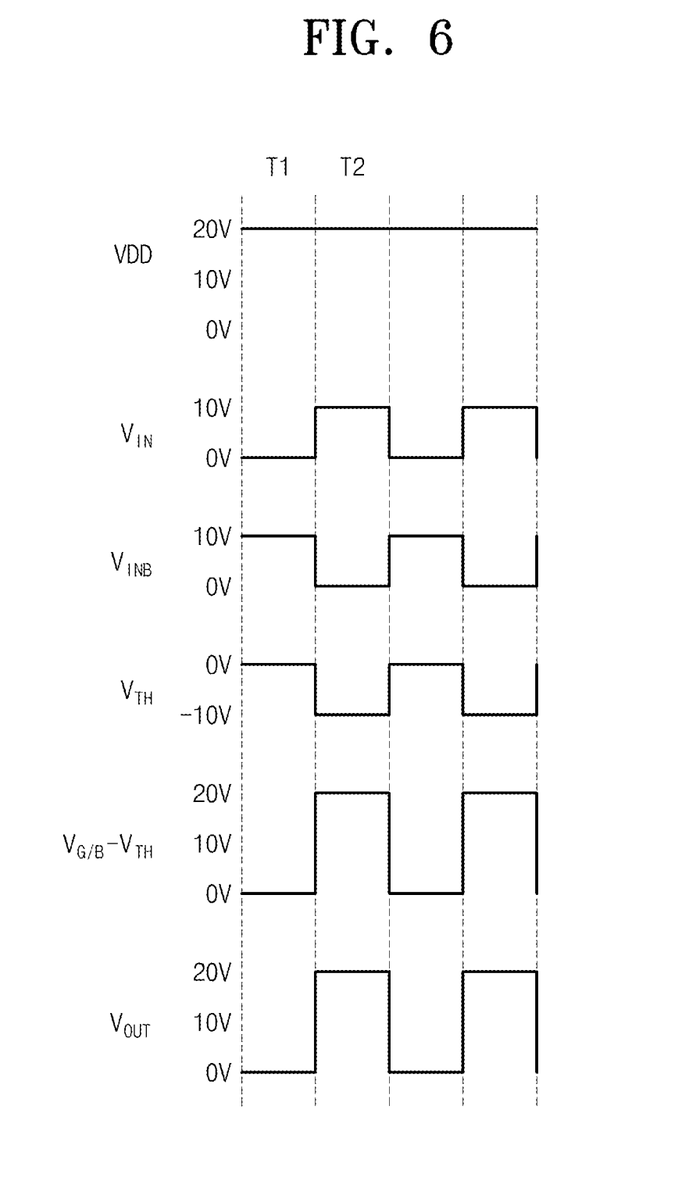
FIG. 6 is a timing diagram showing an operation process of the level shifter circuit according to the first embodiment.

FIG. 5 is a circuit diagram illustrating a level shifter circuit according to a first embodiment. FIG. 6 is a timing diagram showing an operation process of the level shifter circuit according to the first embodiment of.

Referring to FIG. 5, a level shifter circuit 110a may include first and second transistors M1 and M2. Referring to FIGS. 1 and 5, a signal applied to first and second input terminals IN and INB may be a level control signal LCS applied from the timing controller 150. In addition, a signal output from an output terminal OUT may be a driving voltage DS.

A first transistor M1 is assumed to be an NMOS transistor. In addition, the first transistor M1 is assumed to be a double gate transistor including two gates of a top gate (hereinafter referred to TG) or a bottom gate (hereinafter referred to BG). The first transistor M1 is connected between a power source terminal VDD and a first node n1. The TG and BG of the first transistor M1 are connected to the first input terminal IN.

A second transistor M2 is assumed to be an NMOS transistor. The second transistor M2 is connected between the first node n1 and a ground terminal VSS. In addition, the gate terminal is connected to the second input terminal INB. The output terminal OUT is connected to the first node n1.

Referring to FIGS. 5 and 6, a first input signal $V_{IN}$ having a first level L1 of a high state and a second level L2 of a low state may be applied to the first input terminal IN. In addition, a second input signal $V_{INB}$ having the first level L1 of a high state and the second level L2 of a low state is applied to the second input terminal INB. The second input signal $V_{INB}$ may be a complementary signal to the first input signal $V_{IN}$. For example, the first level L1 of a signal is 10 V. In addition, the second level L2 of the signal is 0V.

An output signal $V_{OUT}$ having a high state of a third level L3 may be output through the output terminal OUT. For example, the third level L3 of a signal is 20V. In addition, an output signal $V_{OUT}$ of the second level L2 may be output through the output terminal OUT.

In the inventive concept, a power source voltage VDD of the third level L3 is applied to the power source terminal VDD.

Referring to FIGS. 5 and 6, during a first time T1, the first input signal $V_{IN}$ of the second level L2 may be applied to the first input terminal IN. As the first input signal $V_{IN}$ of the second level L2 may be applied to the TG of the first transistor M1, the threshold voltage $V_{TH}$ of the first transistor M1 may become the second level L2. In addition, the first input signal $V_{IN}$ of the second level L2 may be applied to the BG of the first transistor M1, and the first transistor M1 may be turned off.

The second input signal $V_{INB}$ of the first level L1 may be applied to the second input terminal INB. As the second input signal $V_{INB}$ of the first level L1 is applied to a gate terminal of the second transistor M2, the second transistor M2 is turned on. As the first transistor M1 is turned off and the second transistor M2 is turned on, a voltage level of the first node n1 becomes the second level L2. Accordingly, an output signal $V_{OUT}$ of the second level L2 may be output through the output terminal OUT.

During a second time T2, the first input signal $V_{IN}$ of the first level L1 is applied to the first input terminal IN. As the first input signal $V_{IN}$ of the second level L1 is applied to the TG of the first transistor M1, the threshold voltage $V_{TH}$ of the first transistor M1 is changed to −10 V, which is a reversed value of the first input signal $V_{IN}$ of the first level L1. In addition, as the first input signal $V_{IN}$ of the first level L1 is applied to the BG of the first transistor M1, the first transistor M1 is turned off.

In this case, an overdrive voltage ($V_{G/B}-V_{TH}$) is changed to a voltage of the third level L3. Accordingly, the first transistor M1 may transfer a voltage (e.g. 20 V) of the third level L3. The overdrive voltage is a difference between the BG voltage $V_{G/B}$ and the threshold voltage $V_{TH}$. In other words, the overdrive voltage may mean a transferable voltage of a transistor, which is applied to a channel of the transistor, after the channel is established. When the first transistor M1 is turned on, the power source voltage VDD of the third level L3 is applied to the first node n1.

The second input signal $V_{INB}$ of the second level L2 may be applied to the second input terminal INB. As the second input signal $V_{INB}$ of the second level L2 is applied to a gate terminal of the second transistor M2, the second transistor M2 is turned on. When the second transistor M2 is turned off, the power source voltage VDD of the third level L3 applied to the first node n1 is output through the output terminal OUT.

The level shifter circuit 110a according to a first embodiment may use a depletion mode having a negative threshold voltage. In detail, the output voltage $V_{OUT}$ may be adjusted from a voltage (e.g. 0 V) of the first level to a voltage (e.g. 20V) of the third level L3 by allowing the level shifter circuit 110a to operate in an enhancement mode and the depletion mode in which the threshold voltage $V_{TH}$ of the first transistor M1 is 0 V or higher.

Figure 7:
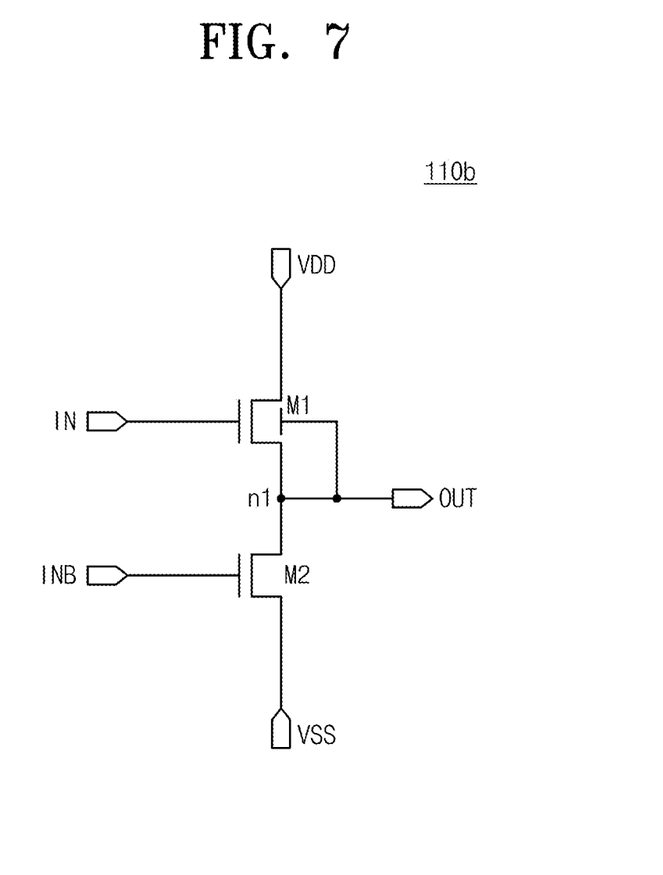
FIG. 7 is a circuit diagram illustrating a level shifter circuit according to a second embodiment.
Figure 8:
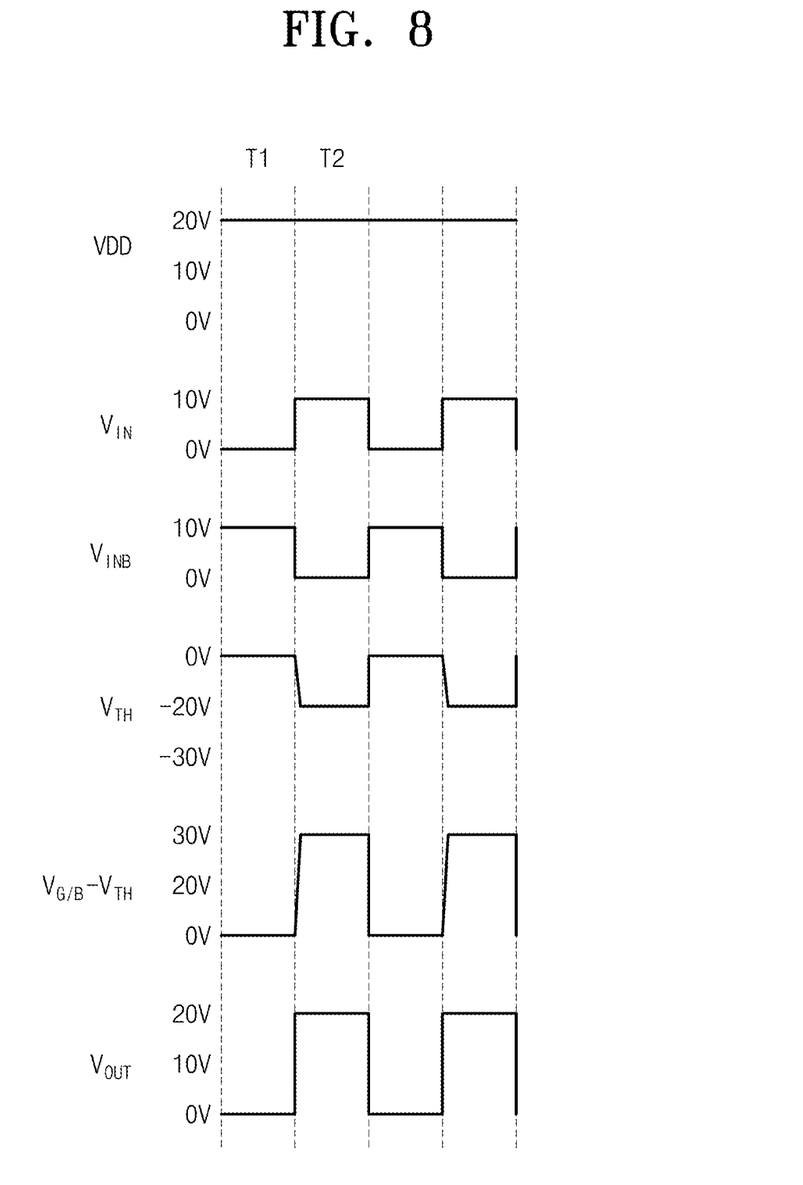
FIG. 8 is a timing diagram showing an operation process of the level shifter circuit according to the second embodiment.

FIG. 7 is a circuit diagram illustrating a level shifter circuit according to a second embodiment. FIG. 8 is a timing diagram showing an operation process of a level shifter circuit according to the second embodiment.

Referring FIGS. 5 and 7, a level shifter circuit 110b illustrated in FIG. 7 has a similar structure to the level shifter circuit 110a illustrated in FIG. 1. However, in a second embodiment, the TG of the first transistor M1 is connected between the first node n1 and the output terminal OUT.

Referring to FIGS. 1 and 7, a signal applied to first and second input terminals IN and INB may be a level control signal LCS applied from the timing controller 150. In addition, a signal output from an output terminal OUT may be a driving voltage DS.

Referring to FIGS. 7 and 8, a power source voltage VDD of the third level L3 may be applied to the power source terminal VDD.

During a first time T1, the second input signal $V_{INB}$ of the first level L1 is applied to the second input terminal INB. As the second input signal $V_{INB}$ of the first level L1 is applied to a gate terminal of the second transistor M2, the second transistor M2 is turned on. Accordingly, the voltage level of the first node n1 becomes the second level L2, and a voltage of the second level L2 is applied to the TG of the first transistor M1. Accordingly, the threshold voltage $V_{TH}$ of the first transistor M1 is the second level L2.

The first input signal $V_{IN}$ of the second level L2 is applied to the first input terminal IN. As the first input signal $V_{IN}$ is applied to the BG of the first transistor M1, the first transistor M1 is turned off.

As the first transistor M1 is turned off and the second transistor M2 is turned on, a voltage level of the first node n1 becomes the second level L2. Accordingly, an output signal $V_{OUT}$ of the second level L2 may be output through the output terminal OUT.

During a second time T2, the first input signal $V_{IN}$ of the first level L1 is applied to the first input terminal IN. As the first input signal $V_{IN}$ is applied to the BG of the first transistor M1, the first transistor M1 is turned on. When the first transistor M1 is turned on, the power source voltage VDD of the third level L3 is gradually applied to the TG connected to the first node n1.

As the power source voltage VDD of the third level L3 is gradually applied to the TG, the threshold voltage $V_{TH}$ of the first transistor M1 is changed to −20 V, which is a reversed value of the power supply voltage VDD of the third level L3. Since the overdrive voltage ($V_{G/B}-V_{TH}$) of the first transistor M1 is changed to 30 V, the first transistor M1 may deliver a voltage of 30 V.

The second input signal $V_{INB}$ of the second level L2 may be applied to the second input terminal INB. As the second input signal $V_{INB}$ of the second level L2 is applied to a gate terminal of the second transistor M2, the second transistor M2 is turned off. When the second transistor M2 is turned off, the power source voltage VDD of the third level L3 applied to the first node n1 is output through the output terminal OUT.

Compared to the level shifter circuit 110a according to the first embodiment, the level shifter circuit 110b according to the second embodiment may provide enhanced transfer performance of the output voltage VDD. Since the first transistor M1 of the level shifter circuit 110b according to the second embodiment is capable of transferring a higher voltage than the power source voltage VDD of a state of the third level L3, the power source voltage VDD may be output without a loss.

Accordingly, the level shifter circuit 110b according to the second embodiment may be used in a large screen display in which a long clock line is to be driven.

Figure 9:
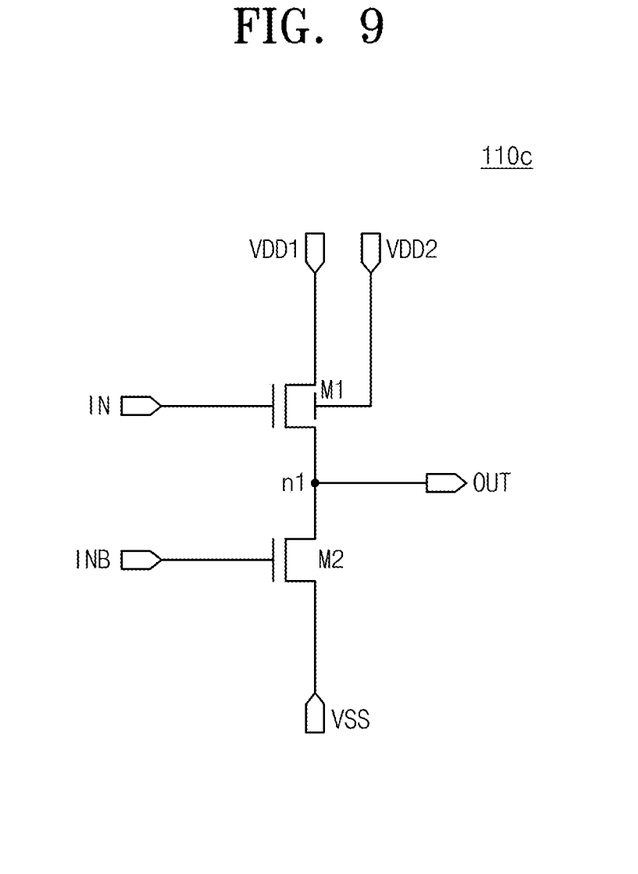
FIG. 9 is a circuit diagram illustrating a level shifter circuit according to a third embodiment.
Figure 10:
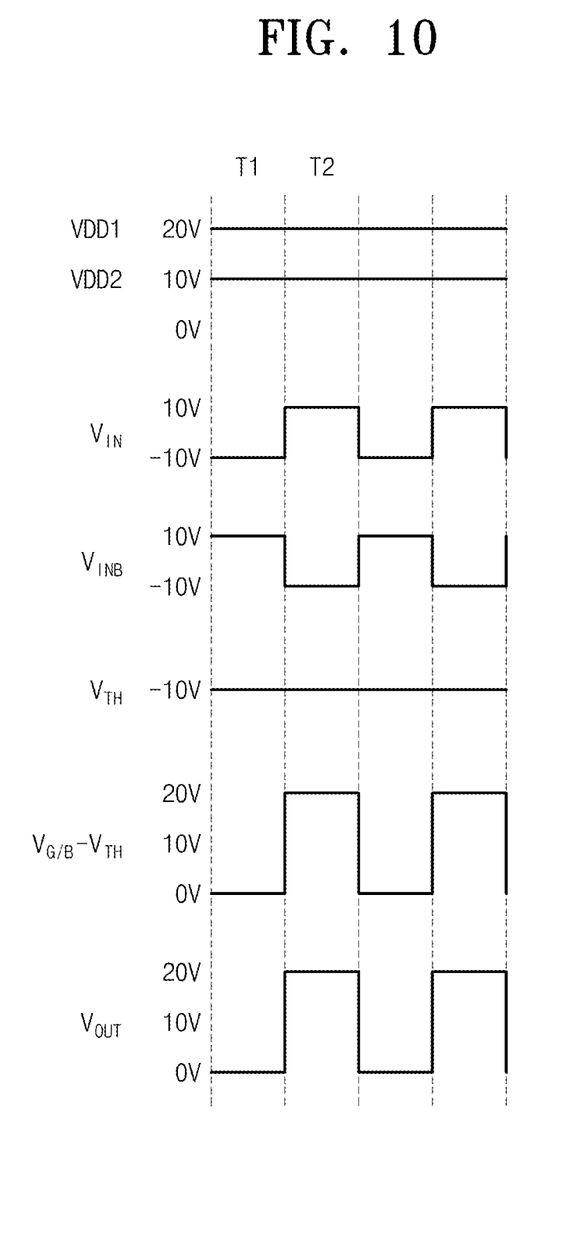
FIG. 10 is a timing diagram showing an operation process of the level shifter circuit according to the third embodiment.

FIG. 9 is a circuit diagram illustrating a level shifter circuit according to a third embodiment. FIG. 10 is a timing diagram showing an operation process of a level shifter circuit according to the third embodiment.

Referring FIGS. 5 and 9, a level shifter circuit 110c illustrated in FIG. 9 has similar structure to the level shifter circuit 110a illustrated in FIG. 1. However, in the third embodiment, the TG of the first transistor M1 is connected to the second power source terminal VDD2. Referring to FIGS. 1 and 9, a signal applied to first and second input terminals IN and INB may be a level control signal LCS applied from the timing controller 150. In addition, a signal output from an output terminal OUT may be a driving voltage DS.

A first power source terminal VDD1 of FIG. 9 is identical to the power source terminal VDD of FIGS. 4 to 7. In the third embodiment, a power source voltage VDD1 of the third level L3 may be applied to the first power source terminal VDD1 and a power source voltage VDD2 of the first level L1 may be applied to the second power source terminal VDD2.

In addition, the first and second input signals $V_{IN}$ and $V_{INB}$ of the first level L1 may be applied and the first and second input signals $V_{IN}$ and $V_{INB}$ of a low state of a fourth level L4 are applied in a predetermined time period to the first and second input terminals IN and INB. For example, the fourth level L4 of a signal is −10V.

During a first time T1, the first input signal $V_{IN}$ of the fourth level L4 is applied to the first input terminal IN. The first input signal $V_{IN}$ of the fourth level L4 is applied to the BG of the first transistor M1. In addition, the second power source voltage VDD2 of the first level L1, which is output from the second power source terminal VDD2, is applied to the TG of the first transistor M1.

As the second power source voltage VDD2 of the third level L1 is applied to the TG, the threshold voltage $V_{TH}$ of the first transistor M1 is changed to −10V, which is a reversed value of the second power supply voltage VDD2 of the first level L1. The overdrive voltage ($V_{G/B}-V_{TH}$) of the first transistor M1 is the second level L2.

The second input signal $V_{INB}$ of the first level L1 is applied to the second input terminal INB and the second transistor M2 is turned on. As the first transistor M1 is turned off and the second transistor M2 is turned on, a voltage of the first node n1 is maintained to be the second level L2. Accordingly, an output signal $V_{OUT}$ of the second level L2 may be output through the output terminal OUT.

During a second time T2, the first input signal $V_{IN}$ of the first level L1 is applied to the first input terminal IN. The first input signal $V_{IN}$ of the first level L1 is applied to the BG of the first transistor M1. In addition, the second power source voltage VDD2 of the first level L1 may be applied to the TG of the first transistor M1, and may be output from the second power source terminal VDD2.

As the second power source voltage VDD2 of the first level L1 is applied to the BG, the threshold voltage $V_{TH}$ of the first transistor M1 is changed to −10V, which is a reversed value of the second power supply voltage VDD2 of the first level L1. Accordingly, since the overdrive voltage ($V_{G/B}-V_{TH}$) of the first transistor M1 is the third level L3, the first transistor M1 may deliver a voltage of 20 V (voltage of the third level L3).

When the second transistor M2 is turned off, the power source voltage VDD of the third level L3 applied to the first node n1 is output through the output terminal OUT.

Figure 11:
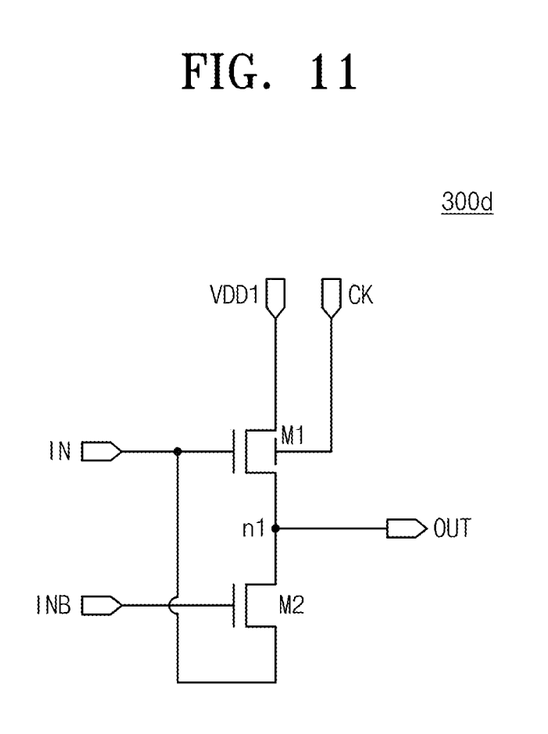
FIG. 11 is a circuit diagram illustrating a level shifter circuit according to a fourth embodiment.
Figure 12:
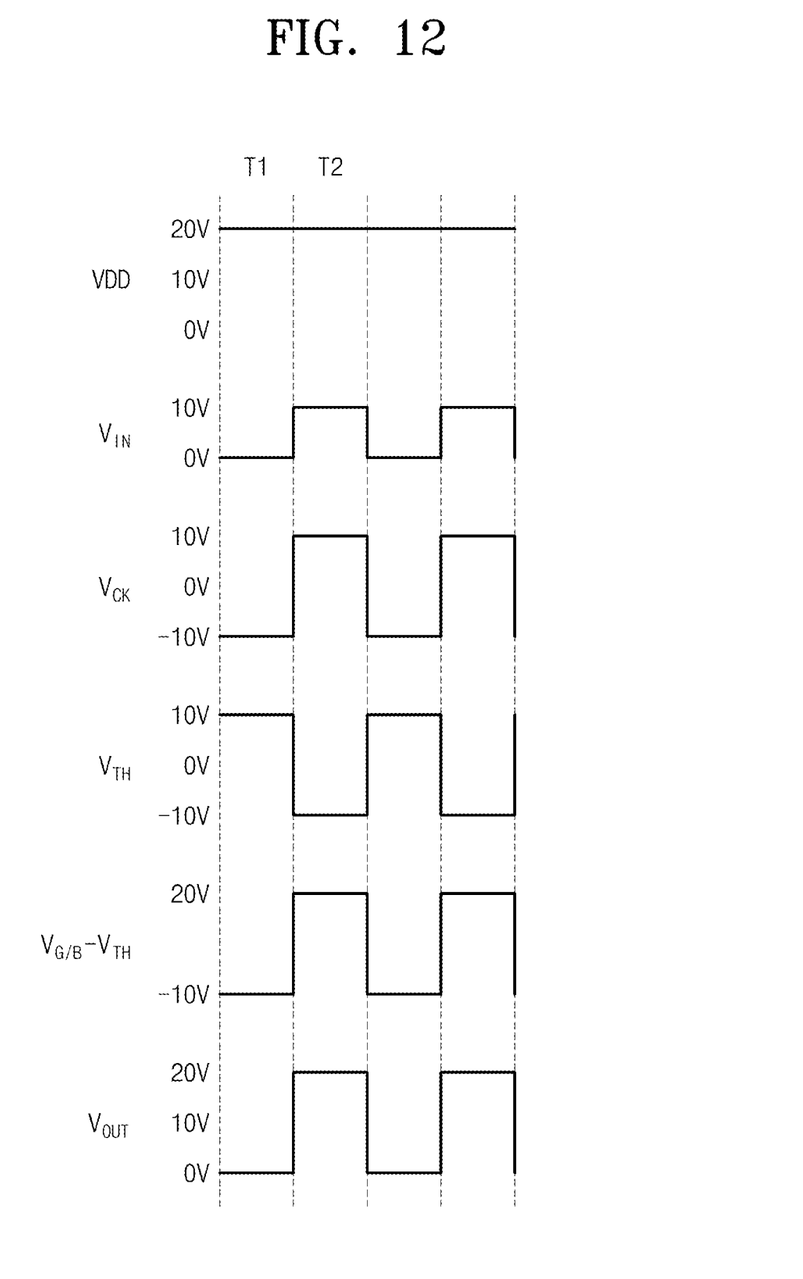
FIG. 12 is a timing diagram showing an operation process of the level shifter circuit according to the fourth embodiment.

FIG. 11 is a circuit diagram illustrating a level shifter circuit according to a fourth embodiment. FIG. 12 is a timing diagram showing an operation process of the level shifter circuit according to the fourth embodiment.

Referring FIGS. 1 and 111, a level shifter circuit 110d illustrated in FIG. 11 has similar structure to the level shifter circuit 110a illustrated in FIG. 1. However, in the fourth embodiment, the BG of the first transistor M1 is connected to a clock terminal CK. In addition, the second transistor is connected between the first node n1 and the input terminal IN. Referring to FIGS. 1 and 11, a signal applied to first and second input terminals IN and INB may be a level control signal LCS applied from the timing controller 150. In addition, a signal output from an output terminal OUT may be a driving voltage DS.

In the fourth embodiment, a clock signal $V_{CK}$ of the fourth level L4 and a clock signal $V_{CK}$ of the first level L1 are applied in a predetermined time period to the clock terminal CK.

During a first time T1, the first input signal $V_{IN}$ of the second level L2 may be applied to the first input terminal IN. The first input signal $V_{IN}$ of the second level L2 may be applied to the BG of the first transistor M1. In addition, the clock signal $V_{CK}$ of the fourth level L4 output from the clock terminal CK may be applied to the TG of the first transistor M1.

As the clock signal of the fourth level L4 is applied to the BG, the threshold voltage $V_{TH}$ of the first transistor M1 is changed to 10 V. Since the overdrive voltage ($V_{G/B}-V_{TH}$) of the first transistor M1 is the second level L4, the first transistor M1 is turned off.

As the second input signal $V_{INB}$ of the first level L1 is applied to the second input terminal INB, the second transistor M2 is turned on. As the second transistor M2 is turned on and the first input signal $V_{IN}$ of the second level L2 is applied to one end of the second transistor M2, a voltage of the first node n1 is maintained to be the second level L2. Accordingly, an output signal $V_{OUT}$ of the second level L2 may be output through the output terminal OUT.

During a second time T2, the first input signal $V_{IN}$ of the first level L1 may be applied to the first input terminal IN. The first input signal $V_{IN}$ of the first level L1 is applied to the BG of the first transistor M1 and one end of the second transistor M2. In addition, the clock signal $V_{CK}$ of the first level L1 is applied to the TG of the first transistor M1. Accordingly, the threshold voltage $V_{TH}$ of the first transistor M1 is changed to −10 V, which is a reversed value of the clock signal $V_{CK}$ of the first level L1. Accordingly, since the overdrive voltage ($V_{G/B}-V_{TH}$) of the first transistor M1 is the third level L3, the first transistor M1 may deliver a voltage of 20V.

When the second transistor M2 is turned off by the second input signal of the second level L2 applied to the gate thereof, the power source voltage VDD of the third level L3 applied to the first node n1 is output through the output terminal OUT.

During a second time T2, as the second input signal $V_{INB}$ of the second level L2 is applied to the gate of the second transistor M2 and the first input signal $V_{IN}$ of the first level L1 is applied to one end thereof, current between the input terminal IN and the output terminal OUT is completely cut off. Accordingly, the level shifter circuit 300d illustrated in FIG. 11 may compensate for an operation of the depletion mode to realize a circuit for reducing power consumption.

According to an embodiment of the inventive concept, power efficiency may be improved in a depletion mode or an enhance mode by providing a main transistor of a level shifter circuit with a double gate transistor.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A level shifter circuit comprising:
   a first transistor connected between a power source terminal of the level shifter circuit and an output terminal of the level shifter circuit, the first transistor being configured to transmit, in response to a first signal and a second signal, a power source voltage applied from the power source terminal to the output terminal, the first signal being received from an input terminal of the level shifter circuit through a first gate of the first transistor, the second signal being received through a second gate of the first transistor, the second signal alternating between a negative voltage and a positive voltage; and
   a second transistor connected between the input terminal of the level shifter circuit and the output terminal, the second transistor being configured to transmit a ground voltage from the input terminal to the output terminal in response to a gate signal received through a gate of the second transistor.

2. The level shifter circuit of claim 1, wherein the second signal corresponds to a clock signal, and the second gate of the first transistor receives the clock signal from a clock terminal of the level shifter circuit.

3. The level shifter circuit of claim 2, wherein a period of the clock signal is identical to a period of the first signal.

4. The level shifter circuit of claim 2, wherein when a level of the first signal has a high level, a level of the clock signal has a high level, and
   wherein when the level of the first signal has a low level, the level of the clock signal has a low level.

5. The level shifter circuit of claim 4, wherein a first level difference between the high level of the first signal and the low level of the first signal has a first value,
   wherein a second level difference between the high level of the clock signal and the low level of the clock signal has a second value, and
   wherein the second value is larger than the first value.

6. The level shifter circuit of claim 1, wherein the first transistor is turned on or turned off according to a threshold voltage, the threshold voltage being changed by adjusting a value of the first signal and a value of the second signal.

7. The level shifter circuit of claim 1, wherein the first signal is a periodic signal having a first voltage and the ground voltage alternately,
   wherein a voltage of the output terminal has a second voltage and the ground voltage alternately and periodically, and
   wherein a level of the second voltage is higher than a level of the first voltage.

8. The level shifter circuit of claim 1, wherein the gate signal is logically complementary to the first signal.

9. The level shifter circuit of claim 1, wherein the second transistor has a source connected to the input terminal to transmit the ground voltage from the input terminal to the output terminal through the second transistor when the gate signal has a logical high value.

10. The level shifter circuit of claim 9, wherein the input terminal is a first input terminal, and
    wherein the gate of the second transistor is connected to a second input terminal, the gate signal being a complementary version of the first signal.

11. The level shifter circuit of claim 1, wherein the first transistor is an n-channel metal-oxide semiconductor (NMOS) transistor.

12. The level shifter circuit of claim 1, wherein the second transistor is a single gate transistor.

* * * * *